US007145270B2

(12) United States Patent
Mizuno

(10) Patent No.: US 7,145,270 B2
(45) Date of Patent: Dec. 5, 2006

(54) DRIVING UNIT, EXPOSURE APPARATUS USING THE SAME, AND DEVICE FABRICATION METHOD

(75) Inventor: Makoto Mizuno, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 163 days.

(21) Appl. No.: 10/827,882

(22) Filed: Apr. 20, 2004

(65) Prior Publication Data

US 2004/0212794 A1 Oct. 28, 2004

(30) Foreign Application Priority Data

Apr. 25, 2003 (JP) ............................. 2003-122115
Apr. 5, 2004 (JP) ............................. 2004-110835

(51) Int. Cl.
H02K 41/00 (2006.01)
H02K 7/09 (2006.01)
G03B 27/58 (2006.01)
G03B 27/62 (2006.01)

(52) U.S. Cl. .................. 310/12; 310/90.5; 355/72; 355/75

(58) Field of Classification Search ............... 355/53, 355/72–76; 310/10, 12, 90.5; 318/611, 318/649, 653

See application file for complete search history.

(56) References Cited

U.S. PATENT DOCUMENTS

| | | | | |
|---|---|---|---|---|
| 5,896,961 A | * | 4/1999 | Aida et al. | 188/378 |
| 6,084,329 A | * | 7/2000 | Fujita et al. | 310/90.5 |
| 6,327,026 B1 | * | 12/2001 | Wakui | 355/72 |
| 6,888,620 B1 | * | 5/2005 | Lee et al. | 355/73 |
| 2002/0163741 A1 | * | 11/2002 | Shibazaki | 359/819 |

FOREIGN PATENT DOCUMENTS

JP 11-44834 2/1999
JP 11-233039 8/1999

OTHER PUBLICATIONS

Seto, Kazuo, "Vibration Control Method Using Magnetic Damping," Journal of the Japan Society of Mechanical Engineers, Series C, vol. 56, No. 525, 1990, pp. 1079-1086 (Section 1, 2-3-1. (English Translation Attached).

* cited by examiner

Primary Examiner—Henry Hung Nguyen
(74) Attorney, Agent, or Firm—Morgan & Finnegan LLP

(57) ABSTRACT

A driving unit includes an actuator for actuating a target and a magnetic dampener for controlling a vibration of the target, wherein the driving unit controls the vibration of the target, which is generated by the actuation of the actuator, by using the magnetic dampener.

24 Claims, 15 Drawing Sheets

PRIOR ART

DRIVING UNIT, EXPOSURE APPARATUS USING THE SAME, AND DEVICE FABRICATION METHOD

This application claims priority benefits under 35 U.S.C. §119 based on Japanese Patent Application No. 2003-122115 filed on Apr. 25, 2003, and Japanese Patent Application No. 2004-110835 filed on Apr. 5, 2004, which are hereby incorporated by reference herein in their entirety as if fully set forth herein.

BACKGROUND OF THE INVENTION

The present invention relates generally to fine driving units, and more particularly to units for finely adjusting the positions and tilts of optical elements, such as lenses or mirrors, used in exposure apparatuses for fabrication of semiconductor devices or liquid crystal devices, etc. The present invention also relates to driving units for finely adjusting the positions and tilts of the optical elements to acquire accurate imaging in relation to the projection exposing images of the original forms (masks or reticles, etc.) onto objects (wafers, etc.) and to the exposure apparatuses using the same. The driving unit according to this invention is not only applicable to exposure apparatuses which needs fine adjustment to the position and tilt of the optical element, but also applicable to an apparatus, such as a sample stage of an electron microscope, which needs fine adjustment in vacuum state to avoid dusts or specific outgas.

A semiconductor exposure apparatus transfers different kinds of patterns on an original form (reticle) onto a silicon wafer (substrate). Besides improving resolution, it is also necessary to obtain overlay accuracy for fabricating a high integrated circuit.

The propagation of vibrations from inside and/or outside the exposure apparatus to an optical element (mirrors and the like) in the exposure apparatus lowers the resolution and/or overlay accuracy. For example, vibrations from outside the exposure apparatus can be the vibration of the building where the exposure apparatus is installed. There are two kinds of vibration from inside the exposure apparatus. One is caused and propagated to the optical element via a structure frame by operation of a reticle stage. The other is caused and propagated to the optical element by operation of an actuator for adjusting the optical element. The actuator for adjusting the optical element (a target) should be operated in two patterns to improve optical performance. The first pattern should be relatively static, with the actuator operated between the former exposure process and the latter exposure process. The second pattern should operate the actuator during exposing. The second one may have problems with vibration caused and propagated to the optical element by the actuator. The vibration which is generated by operation of the actuator to move the target, such as a mirror, causes a bigger problem, especially for EUV light (10 to 15 nm) used in an EUV exposure apparatus which has a shorter wavelength than KrF (248 nm) and ArF (193 nm) used in a conventional exposure apparatus. To improve the resolution and the overlay accuracy, a vibration controller for controlling the vibration by transforming vibration energy to other energies, such as heat energy, electrical energy, or mechanical energy, has been developed Japanese Patent Application Publication No.11-233039 (JP11-233039) discloses a vibration controller using friction that can be used in vacuum state.

Japanese Patent Application Publication No.11-044834 (JP11-044834) discloses an actuator, which has vibration controlling function using the squeeze-film effect of a viscous material 34, such as oil or grease. FIG. 12 shows sectional perspective view of the actuator with vibration controlling functions using the viscous material 34 disclosed in JP11-044834. The actuator controls the output of a flange 32 by adjusting the pressure in a bellows 31 with a pressure controller (not shown). The actuator also controls the vibration by having the viscous material 34 in a gap formed in a support member and arranged in the bellows 31. This can provide a clean unit, for example, for maintaining outgas emitted from the viscous material 34 inside the bellows 31. The actuator, depending on the inserting method of the viscous material 34, in addition to eliminating the influence of unwanted outgas, can be used in vacuum state.

However, the method used in the vibration controller disclosed in JP11-233039 cannot be applied to an apparatus such as an EUV exposure apparatus which because the minute dust generated with the friction lowers the performance of the EUV exposure apparatus, is easily troubled by a little dust.

The method described in JP11-044834 may cause aged deterioration in the vibration control effectiveness due to the influence of the frequent vibration.

BRIEF SUMMARY OF THE INVENTION

Accordingly, it is an exemplary object to provide a driving unit and an exposure apparatus which can be used in vacuum state, and use a vibration control mechanism with small aged deterioration and stable vibration control effect.

A driving unit of one aspect according to the present invention includes an actuator for actuating a target and a magnetic dampener for controlling the vibration of the target, wherein the driving unit controls the vibration of the target, which is generated by the actuation of the actuator, by using the magnetic dampener.

The driving unit may further include a magnetic spring, wherein the driving unit controls the vibration of the target by using the magnetic spring and the magnetic dampener. The actuator may include a piezoelectric element.

The driving unit may include at least one first magnet fixed to the target, an additional weight located at a specific distance from the target, at least one second magnet having a polarity opposite to the first magnet and fixed to the additional weight to face the first magnet, and a conductor plate arranged between the first magnet and the second magnet. The conductor plate may be fixed to the target or the additional weight. The conductor plate may be fixed to a fixing block, which is different from the target or the additional weight. The conductor plate may include a cooling unit, which cools the target. The cooling unit may cool the target by radiation. The cooling unit having a radiation element facing the target may cool the target by using the radiation element. The driving unit may include a Peltier device for cooling the radiation element.

The driving unit may include at least one third magnet fixed to the target and at least one fourth magnet arranged to be repellent to the third magnet, wherein the fourth magnet is fixed to the additional weight to face the third magnet.

The driving unit may include a bearing for joining the target and the additional weight, wherein the bearing substantially maintains the relative positions between the target and the additional weight in a specific direction.

The bearing may allow the target and the additional weight to move in two directions, approximately perpendicular to the specific direction. The specific direction may be the same as the magnetic flux direction between at least one first magnet and at least one second magnet. The bearing may include an elastic hinge. The bearing may include a pair of permanent magnets with the same polar facing each other. The bearing may include a leaf spring. The bearing may include a ball bearing. The bearing may include a hydrostatic bearing. A ventilator may be provided around the hydrostatic bearing.

The driving unit may further include a magnetic flux generator for generating a magnetic flux in a first direction and a coil having a straight part along a second direction perpendicular to the first direction, wherein the driving unit controls the vibration of the target in a third direction, which is perpendicular to both the first and the second directions.

The coil may be fixed to the target, and the magnetic flux generator may be fixed to a structure supported independently from the target. The coil may include a first straight part and a second straight part in which current flows in a direction opposite to the flow direction in the first straight part, and the magnetic flux near the first straight part is substantially opposite to that near the second straight part.

The target may include an optical element. The optical element may be a reflection element.

A vibration control block of another aspect according to the present invention includes a vibration control material inserted in a hollow part. The vibration control material may have a dampening coefficient of 10 to $10^3$ Ns/m. The vibration control block may be a flat shape. The vibration control block may be a rotational symmetry shape. The vibration control material may be any one of foamed rubber, gel, oil, or grease.

A driving unit of still another aspect according to the present invention includes a vibration control block having a vibration control material inserted in a hollow part of the vibration control block.

A driving unit of still another aspect according to the present invention includes an actuator for actuating a target and a vibration control block with a vibration control material inserted in a hollow part, wherein the driving unit uses the vibration control block to control the vibration of the target. The vibration is generated by the actuation of the actuator.

An exposure apparatus of still another aspect according to the present invention includes a driving unit, which has an actuator for actuating a target and a magnetic dampener for controlling a vibration of the target, wherein the driving unit uses the magnetic dampener to control the vibration of the target. The vibration is generated by the actuation of the actuator.

An exposure apparatus of still another aspect according to the present invention includes a driving unit arranged in a vacuum state, wherein the driving unit has an actuator for actuating a target and a magnetic dampener for controlling the vibration of the target, wherein the driving unit uses the magnetic dampener to control the vibration of the target. The vibration is generated by the actuation of the actuator.

An exposure apparatus of still another aspect according to the present invention includes an illumination system for guiding light from a light source to a mask, a projection optical system for guiding the light from the mask to an object, wherein a driving unit controls the vibration of a target included in the illumination optical system and a target included in the projection optical system. The driving unit has an actuator for actuating the target and a magnetic dampener for controlling the vibration of the target, wherein the driving unit uses the magnetic dampener to control the vibration of the target. The vibration is generated by the actuation of the actuator.

The exposure apparatus may further include a light source emitting light of 10 to 15 nm wavelengths.

A device fabricating method of still another aspect according to the present invention includes the steps of exposing an object by using an exposure apparatus comprising a driving unit which has an actuator for actuating a target and a magnetic dampener for controlling the vibration of the target, wherein the driving unit uses the magnetic dampener to control the vibration of the target which is generated by the actuation of the actuator, and developing the object that has been exposed.

A device fabricating method of still another aspect according to the present invention includes the steps of exposing an object by using an exposure apparatus comprising a driving unit arranged in a vacuum state, wherein the driving unit has an actuator for actuating a target and a magnetic dampener for controlling the vibration of the target, where the driving unit uses the magnetic dampener to control the vibration of the target which is generated by the actuation of the actuator, and developing the object that has been exposed.

A device fabricating method of still another aspect according to the present invention includes the steps of exposing an object by using an exposure, apparatus comprising an illumination system for guiding a light from a light source to a mask, a projection optical system for guiding the light from the mask to an object, wherein a driving unit controls the vibration of a target included in the illumination optical system and a target included in the projection optical system, the driving unit has an actuator for actuating the target and a magnetic dampener for controlling a vibration of the target, where the driving unit uses the magnetic dampener to control the vibration of the target which is generated by the actuation of the actuator, and developing the object that has been exposed.

An exposure apparatus of still another aspect according to the present invention includes a driving unit which has an actuator for actuating a target, a magnetic dampener for controlling a vibration of the target, and a magnetic spring, wherein the driving unit controls the vibration of the target, which is generated by the actuation of the actuator, by using the magnetic spring and the magnetic dampener.

An exposure apparatus of still another aspect according to the present invention includes a driving unit arranged in a vacuum state, wherein the driving unit has an actuator for actuating a target, a magnetic dampener for controlling a vibration of the target, and a magnetic spring, wherein the driving unit controls the vibration of the target, which is generated by the actuation of the actuator, by using the magnetic spring and the magnetic dampener.

An exposure apparatus of still another aspect according to the present invention includes an illumination system for guiding a light from a light source to a mask, and a projection optical system for guiding the light from the mask to an object, wherein a driving unit controls a vibration of a target included in the illumination optical system and a target included in the projection optical system, wherein the driving unit has an actuator for actuating a target, a magnetic dampener for controlling a vibration of the target, and a magnetic spring, wherein the driving unit controls the vibration of the target, which is generated by the actuation of the actuator, by using the magnetic spring and the magnetic dampener.

The exposure apparatus may further include a light source emitting light of 10 to 15 nm wavelengths.

A device fabricating method of still another aspect according to the present invention includes the steps of exposing an object by using an exposure apparatus comprising a driving unit which has an actuator for actuating a target, a magnetic dampener for controlling a vibration of the target, and a magnetic spring, wherein the driving unit controls the vibration of the target, which is generated by the actuation of the actuator, by using the magnetic spring and the magnetic dampener, and developing the object that has been exposed.

A device fabricating method of still another aspect according to the present invention includes the steps of exposing an object by using an exposure apparatus comprising a driving unit arranged in a vacuum state, wherein the driving unit has an actuator for actuating a target, a magnetic dampener for controlling a vibration of the target, and a magnetic spring, wherein the driving unit controls the vibration of the target, which is generated by the actuation of the actuator, by using the magnetic spring and the magnetic dampener, and developing the object that has been exposed.

A device fabricating method of still another aspect according to the present invention includes the steps of exposing an object by using an exposure apparatus comprising an illumination system for guiding a light from a light source to a mask, and a projection optical system for guiding the light from the mask to an object, wherein a driving unit controls a vibration of a target included in the illumination optical system and a target included in the projection optical system, wherein the driving unit has an actuator for actuating a target, a magnetic dampener for controlling a vibration of the target, and a magnetic spring, wherein the driving unit controls the vibration of the target, which is generated by the actuation of the actuator, by using the magnetic spring and the magnetic dampener, and developing the object that has been exposed.

An exposure apparatus of still another aspect according to the present invention includes a driving unit which has an actuator for actuating a target, a magnetic dampener for controlling a vibration of the target, at least one first magnet fixed to the target, an additional weight located at a specific distance from the target, at least one second magnet having a polarity opposite to the first magnet, and a conductor plate arranged between the first magnet and the second magnet, wherein the driving unit controls the vibration of the target, which is generated by the actuation of the actuator, by using the magnetic dampener, wherein the second magnet is fixed to the additional weight to face the first magnet.

An exposure apparatus of still another aspect according to the present invention includes a driving unit arranged in a vacuum state, wherein the driving unit has an actuator for actuating a target, a magnetic dampener for controlling a vibration of the target, at least one first magnet fixed to the target, an additional weight located at a specific distance from the target, at least one second magnet having a polarity opposite to the first magnet, and a conductor plate arranged between the first magnet and the second magnet, wherein the driving unit controls the vibration of the target, which is generated by the actuation of the actuator, by using the magnetic dampener, wherein the second magnet is fixed to the additional weight to face the first magnet.

An exposure apparatus of still another aspect according to the present invention includes an illumination system for guiding a light from a light source to a mask, and a projection optical system for guiding the light from the mask to an object, wherein a driving unit controls a vibration of a target included in the illumination optical system and a target included in the projection optical system, wherein the driving unit has an actuator for actuating a target, a magnetic dampener for controlling a vibration of the target, at least one first magnet fixed to the target, an additional weight located at a specific distance from the target, at least one second magnet having a polarity opposite to the first magnet, and a conductor plate arranged between the first magnet and the second magnet, wherein the driving unit controls the vibration of the target, which is generated by the actuation of the actuator, by using the magnetic dampener, wherein the second magnet is fixed to the additional weight to face the first magnet.

The exposure apparatus may further includes a light source emitting light of 10 to 15 nm wavelengths.

A device fabricating method of still another aspect according to the present invention includes the steps of exposing an object by using an exposure apparatus comprising a driving unit which has an actuator for actuating a target, a magnetic dampener for controlling a vibration of the target, at least one first magnet fixed to the target, an additional weight located at a specific distance from the target, at least one second magnet having a polarity opposite to the first magnet, and a conductor plate arranged between the first magnet and the second magnet, wherein the driving unit controls the vibration of the target, which is generated by the actuation of the actuator, by using the magnetic dampener, wherein the second magnet is fixed to the additional weight to face the first magnet, and developing the object that has been exposed.

A device fabricating method of still another aspect according to the present invention includes the steps of exposing an object by using an exposure apparatus comprising a driving unit arranged in a vacuum state, wherein the driving unit has an actuator for actuating a target, a magnetic dampener for controlling a vibration of the target, at least one first magnet fixed to the target, an additional weight located at a specific distance from the target, at least one second magnet having a, polarity opposite to the first magnet, and a conductor plate arranged between the first magnet and the second magnet, wherein the driving unit controls the vibration of the target, which is generated by the actuation of the actuator, by using the magnetic dampener, wherein the second magnet is fixed to the additional weight to face the first magnet, and developing the object that has been exposed.

A device fabricating method of still another aspect according to the present invention includes the steps of exposing an object by using an exposure apparatus comprising an illumination system for guiding a light from a light source to a mask, and a projection optical system for guiding the light from the mask to an object, wherein a driving unit controls a vibration of a target included in the illumination optical system and a target included in the projection optical system, wherein the driving unit has an actuator for actuating a target, a magnetic dampener for controlling a vibration of the target, at least one first magnet fixed to the target, an additional weight located at a specific distance from the target, at least one second magnet having a polarity opposite to the first magnet, and a conductor plate arranged between the first magnet and the second magnet, wherein the driving unit controls the vibration of the target, which is generated by the actuation of the actuator, by using the magnetic dampener, wherein the second magnet is fixed to the additional weight to face the first magnet, and developing the object that has been exposed.

An exposure apparatus of still another aspect according to the present invention includes a driving unit which has an actuator for actuating a target, a magnetic dampener for controlling a vibration of the target, a magnetic flux generator for generating a magnetic flux in a first direction, and a coil having a straight part along a second direction perpendicular to the first direction, wherein the driving unit controls the vibration of the target in a third direction perpendicular to both the first and the second directions, which is generated by the actuation of the actuator, by using the magnetic dampener.

An exposure apparatus of still another aspect according to the present invention includes a driving unit arranged in a vacuum state, wherein the driving unit has an actuator for actuating a target, a magnetic dampener for controlling a vibration of the target, a magnetic flux generator for generating a magnetic flux in a first direction, and a coil having a straight part along a second direction perpendicular to the first direction, wherein the driving unit controls the vibration of the target in a third direction perpendicular to both the first and the second directions, which is generated by the actuation of the actuator, by using the magnetic dampener.

An exposure apparatus of still another aspect according to the present invention includes an illumination system for guiding a light from a light source to a mask, and a projection optical system for guiding the light from the mask to an object, wherein a driving unit controls a vibration of a target included in the illumination optical system and a target included in the projection optical system, wherein the driving unit has an actuator for actuating a target, a magnetic dampener for controlling a vibration of the target, a magnetic flux generator for generating a magnetic flux in a first direction, and a coil having a straight part along a second direction perpendicular to the first direction, wherein the driving unit controls the vibration of the target in a third direction perpendicular to both the first and the second directions, which is generated by the actuation of the actuator, by using the magnetic dampener.

The exposure apparatus may further includes a light source emitting light of 10 to 15 nm wavelengths.

A device fabricating method of still another aspect according to the present invention includes the steps of exposing an object by using an exposure apparatus comprising a driving unit which has an actuator for actuating a target, a magnetic dampener for controlling a vibration of the target, a magnetic flux generator for generating a magnetic flux in a first direction, and a coil having a straight part along a second direction perpendicular to the first direction, wherein the driving unit controls the vibration of the target in a third direction perpendicular to both the first and the second directions, which is generated by the actuation of the actuator, by using the magnetic dampener, and developing the object that has been exposed.

A device fabricating method of still another aspect according to the present invention includes the steps of exposing an object by using an exposure apparatus comprising a driving unit arranged in a vacuum state, wherein the driving unit has an actuator for actuating a target, a magnetic dampener for controlling a vibration of the target, a magnetic flux generator for generating a magnetic flux in a first direction, and a coil having a straight part along a second direction perpendicular to the first direction, wherein the driving unit controls the vibration of the target in a third direction perpendicular to both the first and the second directions, which is generated by the actuation of the actuator, by using the magnetic dampener, and developing the object that has been exposed.

A device fabricating method of still another aspect according to the present invention includes the steps of exposing an object by using an exposure apparatus comprising an illumination system for guiding a light from a light source to a mask, and a projection optical system for guiding the light from the mask to an object, wherein a driving unit controls a vibration of a target included in the illumination optical system and a target included in the projection optical system, wherein the driving unit has an actuator for actuating a target, a magnetic dampener for controlling a vibration of the target, a magnetic flux generator for generating a magnetic flux in a first direction, and a coil having a straight part along a second direction perpendicular to the first direction, wherein the driving unit controls the vibration of the target in a third direction perpendicular to both the first and the second directions, which is generated by the actuation of the actuator, by using the magnetic dampener, and developing the object that has been exposed.

Other objects and further features of the present invention will become readily apparent from the following description of the preferred embodiments with reference to the accompanying drawings.

DETAILED DESCRIPTION OF THE PREFERRED EMBODIMENTS

A magnetic dampener used in a driving unit according to the present invention is a dampener that includes a magnetic circuit made of a magnet, and a conductor. The magnetic dampener applies a vibration controlling force which has an effect opposite to the moving direction and proportional to the moving velocity of the conductor's traversal in an electro-magnetic field (see Collective Treatise of The Japan Society of Mechanical Engineering, C compilation, Vol. 56, No. 525, 1990, p1079-).

"Vibration controlling" uses two types of control method. One is active control of vibration using a controller or the like and the other transforms the vibration energy to other energy, such as heat energy, electrical energy, and mechanical energy. The vibration control means used in this application is the latter type.

[The First Embodiment]

Figure 2:
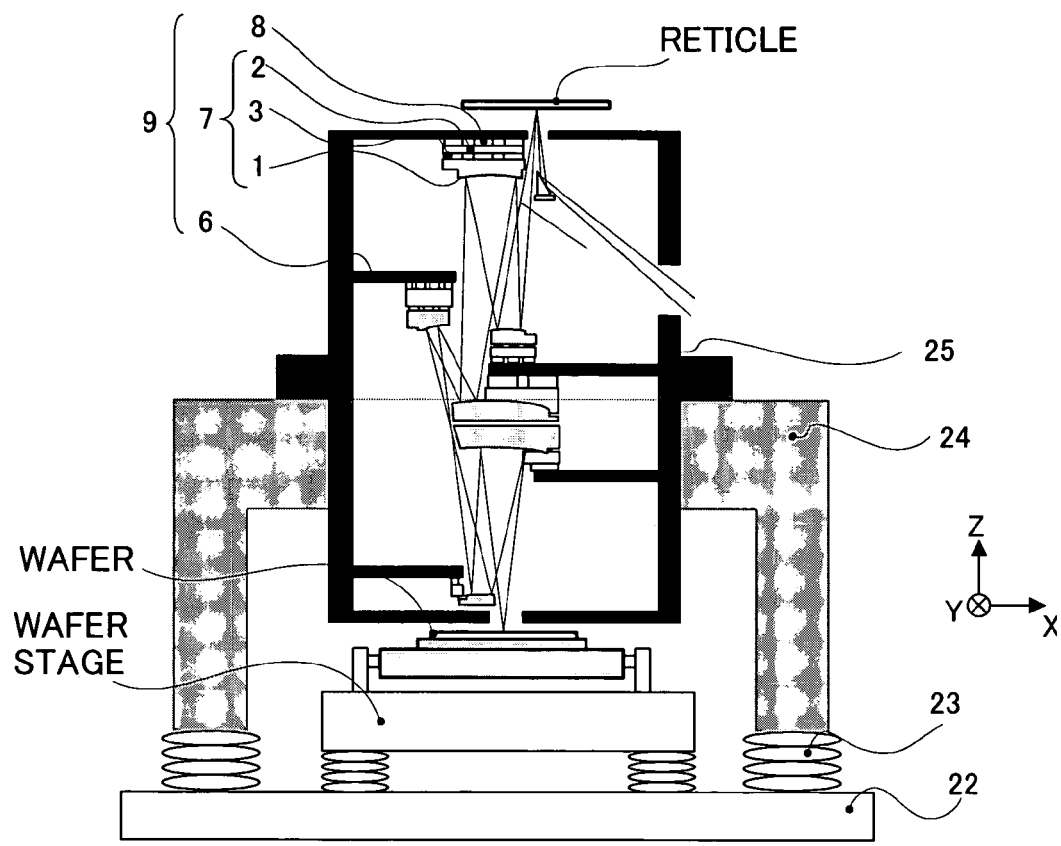
FIG. 2 is a whole view of an exposure apparatus with the mechanism for holding and adjusting the optical element installed.

FIG. 2 is a whole view of an exposure apparatus with an adjustment mechanism 8 installed, which has a holding member 3 for an optical element 1 and a driving unit.

The exposure apparatus is, for example, a reduction projection exposure apparatus (EUV exposure apparatus) using Extreme Ultra Violet light (EUV light) with wavelengths of 10 to 15 nm shorter than ultraviolet light. To prevent the absorption of the EUV light by gas, the inside of the exposure apparatus using the EUV light should maintain a pressure of 100 Pa or smaller, preferably $10^{-4}$ Pa or smaller, for the path of the EUV light. The exposure apparatus includes a light emission unit (not shown), an illumination optical system for illuminating a reticle with the light from the light emission unit (not shown), a reflection-type projection optical system for guiding the light from the reticle onto a wafer (it is preferable that construction be with reflection optical elements only). A system 9 for holding and adjusting the optical element according to the present invention is arranged in the projection optical system or the illumination optical system. The system 9 holds and adjusts an optical element 1 (herein a mirror) so that the projection optical system or the illumination optical system satisfies the preferable optical specification (or so that the aberration of the optical system is at a specific value).

In FIG. 2, a structure frame 24 is installed on a floor 22 via a vibration isolator 23 to support a mirror barrel 25 of the projection optical system. Although, the structure frame 24 only supports the projection optical system in FIG. 2, it may also support the illumination optical system or both the illumination optical system and the projection optical system.

Figure 1:
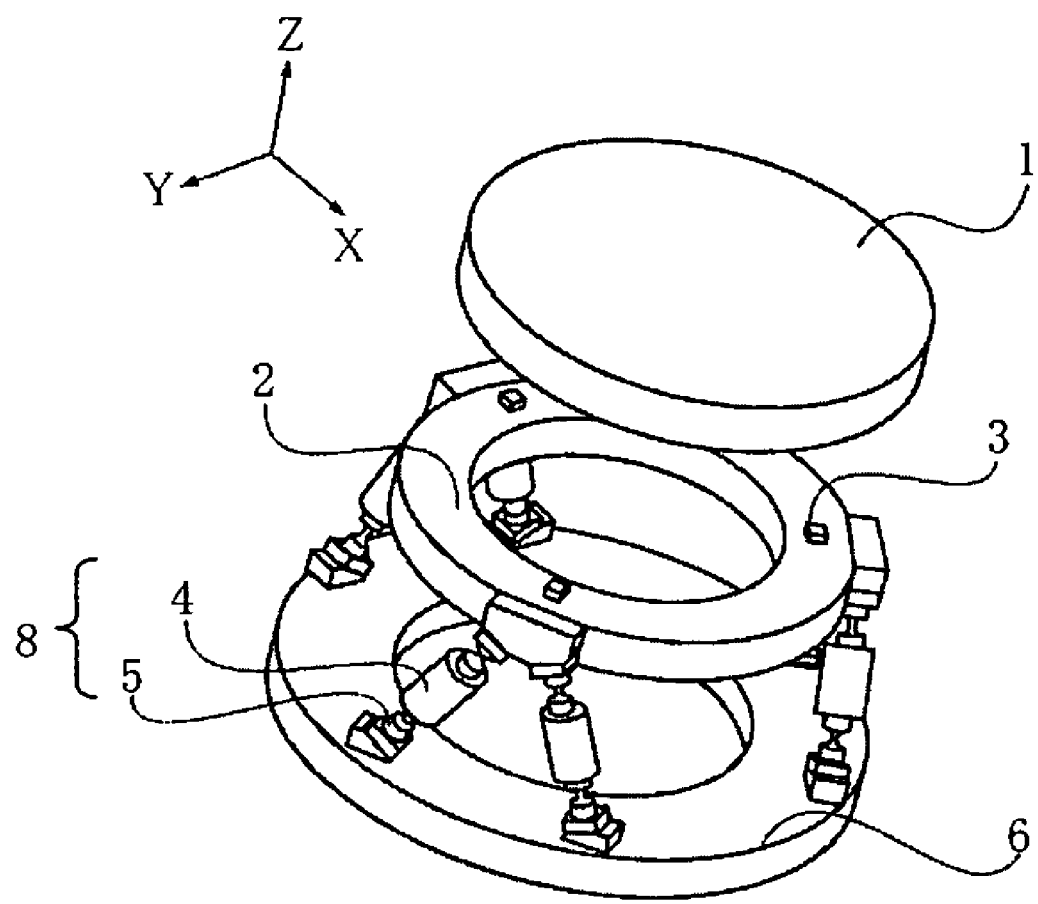
FIG. 1 is a schematic perspective view of a system for holding and adjusting an optical element using a parallel linked mechanism.

FIG. 1 shows an example of the system 9 for holding and adjusting the optical element. An intermediate block 2, holding the optical element 1 as a target with three holding members 3, can be position and tilt controlled by the adjustment mechanism 8. Therefore, the position and tilt of the optical element 1 can be adjusted with the adjustment mechanism.

Here, the gravity center of the triangle formed with the three holding members 3 and the gravity center of the optical element 1 are approximately the same except, as explained before, for a component of the gravity center in the direction perpendicular to a plane formed by the triangle. This makes it possible to distribute the mass of the optical element approximately evenly to the three holding members.

The adjustment mechanism 8 used in this embodiment is, for example, a general bipod-type parallel-linked mechanism with an elastic hinge 5, an actuator 4, etc. The parallel linked mechanism can move (or control the position and tilt of) a movable part 7 (herein, the intermediate block 2, the holding member 3, and the optical element 1) against a fixed block 6 in six degrees of freedom by actuating (or expanding and contracting) six actuators 4 independently. The actuator 4 generally uses a laminated piezoelectric element. It may also use a linear motor, a liquid actuator-like cylinder with bellows, or a motor. The structure of the adjustment mechanism is not limited in this embodiment. It may use other structures which can adjust (if possible, at least in five degrees of freedom, preferably in six degrees of freedom) the position and tilt of the intermediate block 2. For example, an enlarging mechanism or a reduction mechanism is provided in accordance with the adjustment movement and resolution demanded on the optical element 1 to be adjusted because the output displacement is small in cases where the actuator 4 uses the laminated piezoelectric element. Meanwhile, the vibration from outside the exposure apparatus shakes the optical element 1, which is mechanically engaged to the floor 22. In this case, the optical performance of the whole optical system may be lowered depending on the amplitude of the optical element's vibration.

Figure 3:
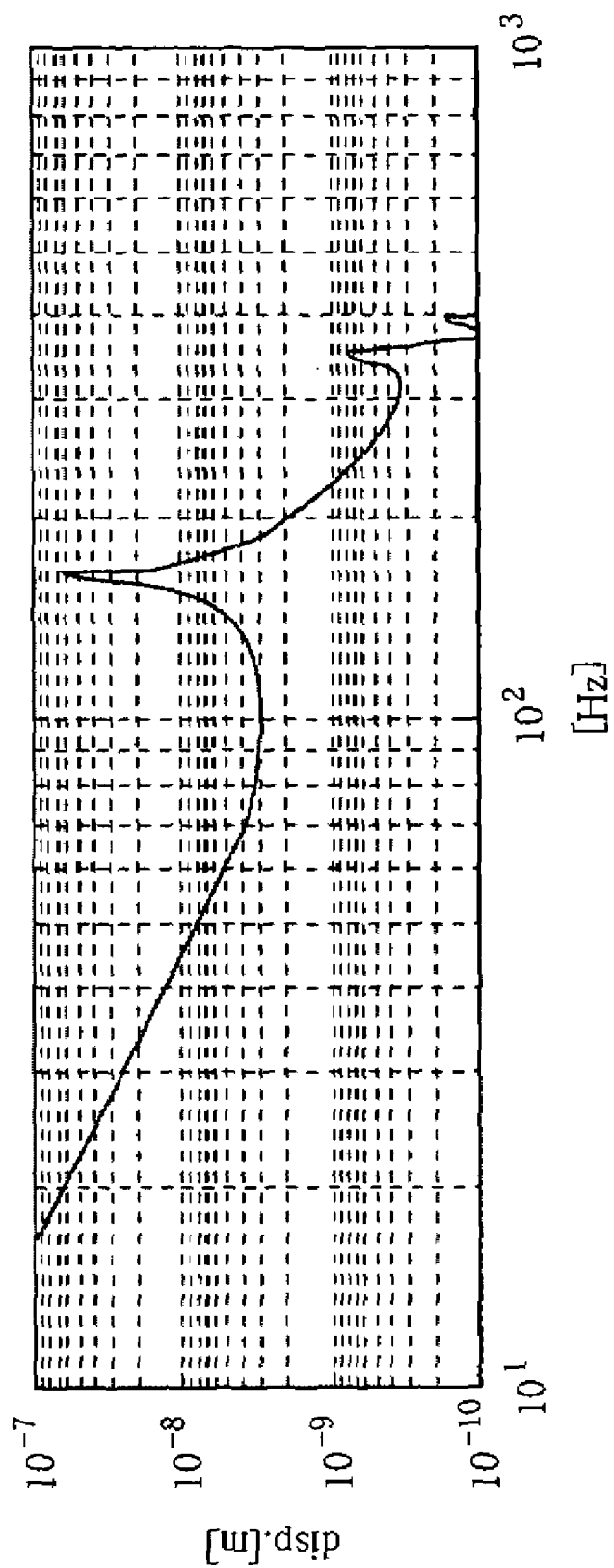
FIG. 3 is a graph, which shows a specification of the optical element in vibration.

FIG. 3 shows a simulation result of vibration (frequency vs. amplitude) of one optical element 1 when, for example, 10 gal (0.1 m/s$^2$) of acceleration is added to the floor 22 shown in FIG. 2. In addition to considering a composed spring constant of the adjustment mechanism 8 and holding member 3, and the weight of the adjustment mechanism 8 and the holding member 3, the calculation has been executed on the assumption that a natural frequency of the whole system for holding and adjusting the optical element is approximately 150 Hz and the dampening factor is 0.05. FIG. 3 shows that the optical element 1 oscillates with its natural frequency (approximately 150 Hz) in about 70 nm of amplitude. One of the following countermeasures will be needed if the amplitude allowance of the optical element 1 is smaller than this value.

1. To decrease the disturbing vibration from the floor 22.
2. To control the disturbing vibration by the vibration isolator (dampener) 23.
3. To increase the natural frequency of the system 9 for holding and adjusting the optical element.
4. To add dampeners to increase the dampening factor of the system 9 for holding and adjusting the optical element.

Method 4 "To add dampeners to increase the dampening factor of the system 9 for holding and adjusting the optical element" is elected in the first embodiment.

Use of a vibration control rubber including gel, an air spring, and friction for dampening of a mechanical structure is well known. However, all of them cannot be used because of dust generation, existence of degas inadequate for the exposure apparatus, and inadaptability to vacuum state. Enclosing materials which generate dust or degas into the bellows does not solve the problem of degradation or aged deterioration from abrasion of materials like rubber, thus increasing assembling process and parts.

Accordingly, this embodiment uses a dynamic dampener (mass dampener) for dampening the vibration. The dynamic dampener is a combination of a magnetic spring 36 which utilizes a restoring force from magnets arranged to attract each other via a bearing, and a magnetic dampener which inserts a conductor plate in a gap between the magnets and utilizes an eddy current proportional to the moving speed of the magnetic field. The conductor plate may be fixed to the optical element (the target), to the additional weight, to the fixed block 6, and to the floor 22.

Figure 4:
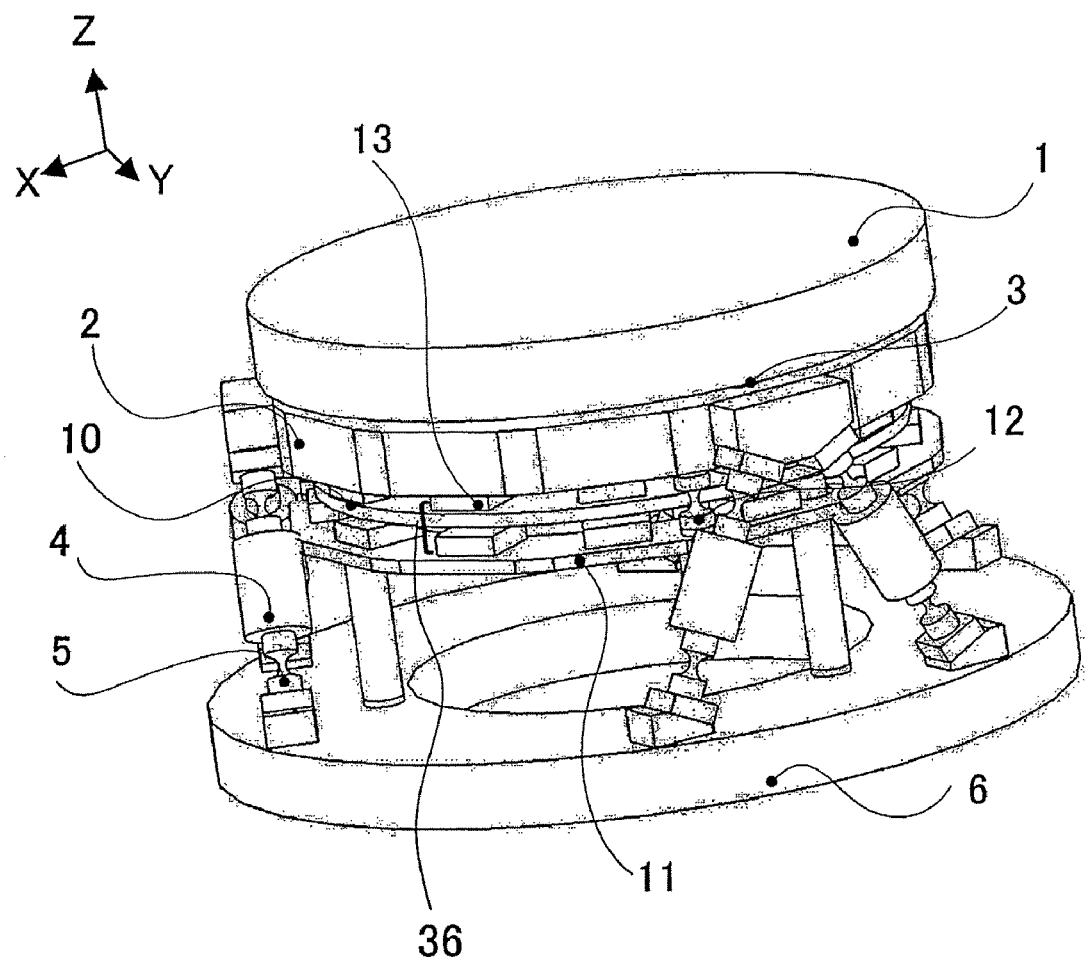
FIG. 4 is a schematic perspective view of a system for holding and adjusting the optical element using a magnetic mass dampener.

FIG. 4 shows the dynamic dampener using the magnetic spring 36 and the magnetic dampener applied to the system 9 for holding and adjusting the optical element shown in FIG. 1. To compose the dynamic dampener, a plurality of (herein, three) bearings 12 is used for the intermediate block 2, and the magnet 13 is fixed onto the additional weight 11 which is supported by the intermediate block 2. The magnet 13 is also fixed on the intermediate block 2 so that the magnet 13 on the additional weight attracts each other. The bearing 12, explained before, substantially limits the additional weight 11 from moving relative to the intermediate block in the Z direction (direction approximately perpendicular to the optical element), but does not limit movement in the X, Y directions. However, the additional weight can move slightly in the Z direction when moving relative to the intermediate block in X, Y directions. Because the bearing shown in FIG. 6 may cause slight movements in the Z direction when there are movements in the X, Y directions, the slight movement in the Z direction is within the scope of this embodiment. The magnetic spring 36 generates the restoring force according to the displacement of the additional weight 11 which moves relative to the intermediate block 2 in XY plane. The conductor 10 supported by the fixed block 6 is arranged in the gap between the magnet 13 that is fixed on the additional weight 11 and on the intermediate block 2. Thus, the magnetic dampener controls the vibration of the intermediate block (the optical element) with the eddy current generated by the relative movement of the additional weight 11.

Moreover, the dampener explained in this embodiment works to control the total vibration in the XY plane of the intermediate block 2, the holding mechanism, and the optical element 1, but hardly moves in the Z direction.

The spring constant k2 and the dampening ratio of the magnetic dampener ζ2 in additional systems using the magnetic spring 36 as the design equation of the dynamic dampener are described respectively:

$$k_2 = k_1 \frac{\mu}{(1+\mu)^2} \quad (1)$$

$$\zeta_2 = \sqrt{\frac{3\mu}{8(1+\mu)}} = \frac{c_2}{2\sqrt{m_2 k_2}} \quad (2)$$

Herein, k1 is the rigidity of the system 9 for holding and adjusting the optical element; μ is a ratio of a weight m2 of the additional weight 11 and a total weight m1 of the intermediate block 2, the holding mechanism, and the optical element 1, i.e. (u=m2/m1); C2 is a dampening coefficient of the magnetic dampener. C2 can be described as follows, where B is a magnetic flux density in the gap of the magnet, V is a volume of the conductor in magnetic flux, ρ is a resistance of the conductor, and C0 is a correction coefficient.

$$c_2 = \frac{\beta^2 V}{\rho} C_0 \quad (3)$$

Seto already estimated a correction coefficient C0 (see Collective Treatise of The Japan Society of Mechanical Engineering, C compilation, Vol. 56, No. 525, 1990, p1079-), as follows:

$$C_0 = 1 - e^{-0.15\alpha} \quad (4)$$

Here, α is a ratio described α=(area of the conductor)/(area of a magnetic pole). It is valid in the range of 2<α<5. Parameters are decided using the above equations.

Optical elements such as a reflection mirror may be deformed due to heat energy absorption from the exposure light in the exposure apparatus. To lower the influence of heat deformation to the optical element 1 from the exposure energy, the optical element 1 should be cooled. To cool the optical element 1, the conductor plate 10 could be used as a cooling device. For example, the conductor plate is used as a radiation plate to cool the optical element 1 or the intermediate block. In this case, the conductor plate 10 is cooled by a Peltier device or liquid coolant. When using coolant, it is preferable that pipes are installed for the flow path of the coolant.

Figure 5:
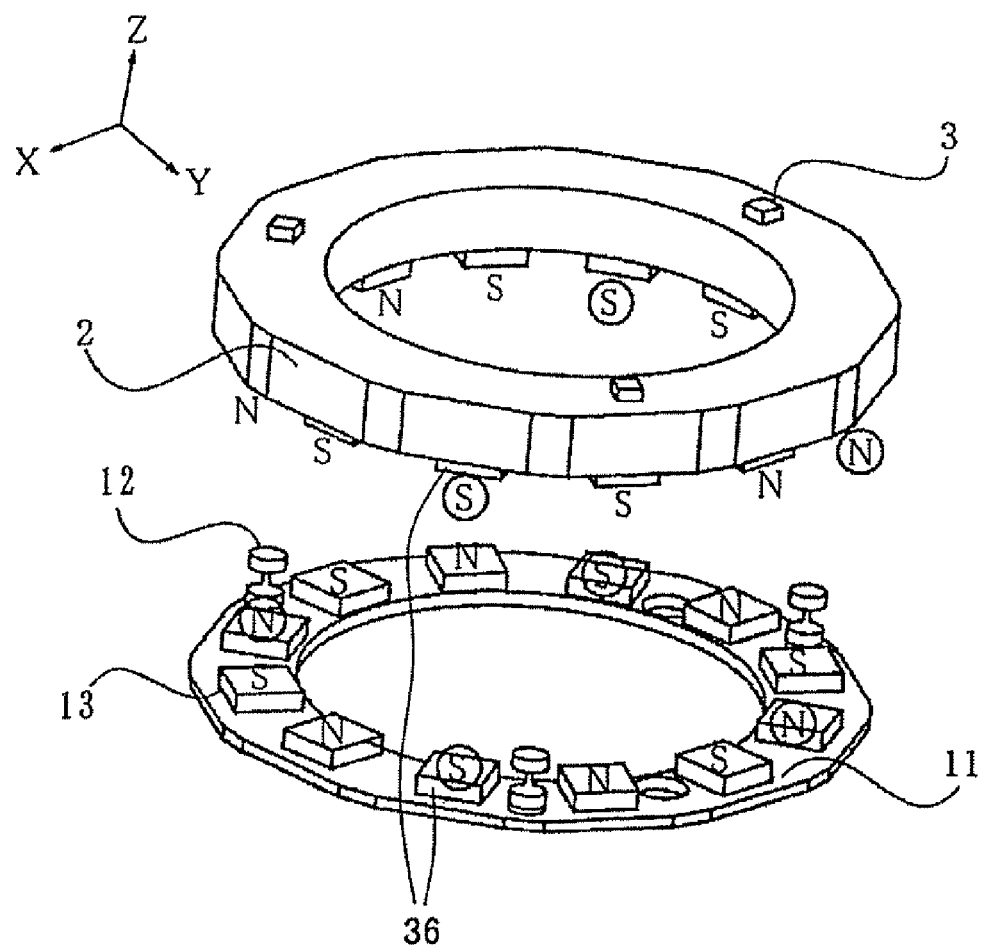
FIG. 5 is a detailed view for explaining a magnetic spring.

FIG. 5 shows a detailed description of a part of the vibration control structure in the system 9 for holding and adjusting the optical element shown in FIG. 4. The target includes not only the intermediate block 2 or the holding member 3 shown in FIG. 5, but also the optical element 1. The annular shaped intermediate block 2 fixes, for example, a total of twelve block magnets 13 on its circumference. The surface polarities "N" and "S" of the magnets 13 are described in FIG. 5. (The polarities of hidden magnets are not shown). The number of the magnets 13 should be an even number but is not limited to twelve. The number should be four or greater, but preferably twelve or more., A magnetic material is preferable for the intermediate block 2 because it can also be a yoke (an element forming a closed magnetic path). If the intermediate block 2 is a non-magnetic material, the yoke, made of a magnetic material, should be inserted between the magnets 13 and the intermediate block 2. The magnet 13 should be adhered to the intermediate block 2 using an adhesive. The degas from the adhesive which is inappropriate for the environment of the exposure apparatus should be shielded so as not to leak out to the optical element's 1 space. The magnets 13 may also be fixed by screws by forming counter borings in the magnets 13.

The same number of magnets 13 that were fixed on the intermediate block 2 is also fixed onto the additional weight 11. Preferably, the additional weight 11 is made of a magnetic material, however, if it is made of a non-magnetic material, a yoke made of a magnetic material should be inserted between the magnets 13 and the additional weight 11.

Figure 6A:
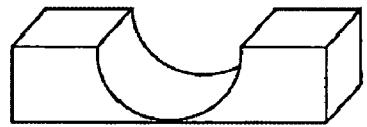
FIG. 6 shows an elastic hinge.
Figure 6B:
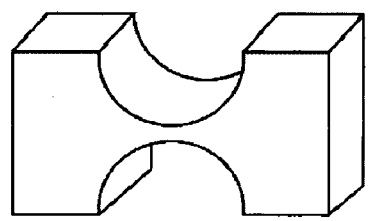
Figure 6C:
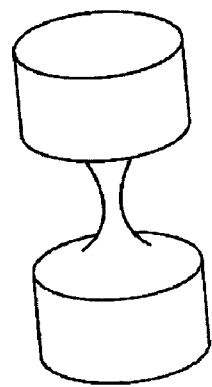

The bearing 12 is provided between the intermediate block 2 and the additional weight 11. The bearing 12 does not limit (because of low rigidity) the relative movement of the intermediate block 2 and the conductor plate 10 in the XY plane, but limits movement (because of high rigidity) in the Z direction. That is, the bearing 12 maintains an approximately constant gap between the intermediate block 2 and the conductor plate 10 to prevent the gap between the intermediate block 2 and the conductor plate 10 from changing (mainly decreasing) due to the suction force of the magnets 13. The bearing 12 uses for example an elastic hinge, a ball bearing, or a hydrostatic bearing. The elastic hinge may combine two bearings whose shape are shown in FIG. 6A and FIG. 6B (the shape being substantially deformable in one direction), may use a bearing that is rotationally symmetrical as shown in FIG. 6C, or may use a combination of a leaf spring (not shown). In cases where the bearings are combined as shown in FIG. 6A and FIG. 6B, it is preferable to combine two bearings so that the deformable direction crosses perpendicularly.

Deformation for buckling of the magnets 13 should be considered when using the elastic hinge as the bearing 12 shown in FIGS. 4 and 5. When the weight of the movable part (the target) is relatively light and the natural frequency of the movable part is relatively low (for example, a few tens Hz), a total spring constant of an additional spring which forms the mass dampener (the magnetic spring 36 and the elastic bearing in XY directions in this case) should be small. Also, it is also not easy to have both high rigidity in the Z direction, enough to resist the suction force of the magnets, and low rigidity in the XY directions. So, it is preferable to use both the elastic bearing 12 and repellent magnets (magnets 13 are arranged between the intermediate block 2 and the additional weight 11 so they face one another to generate repellent force). In FIG. 5, the magnets for repellent whose polarities are indicated with circles (the magnets whose polarities are indicated without circles are attracting each other) are arranged in four portions and balanced according to the gravity center of the movable part 7. Instead of three magnets of the same polarities arrayed in a series on the intermediate block as in this case, one large magnet 13 can be arranged. The arrays of the magnets 13 on the intermediate block 2 and that on the additional weight 11 are exchangeable. The rigidity in Z direction is maintained by arranging eight pairs of magnets for attracting each other and four pairs of magnets for repelling each other between the intermediate block and the additional weight in this embodiment shown in FIG. 5. However, the number and combination of magnets may be changed in accordance with the weight of the movable part or the natural frequency of the target.

Figure 9:
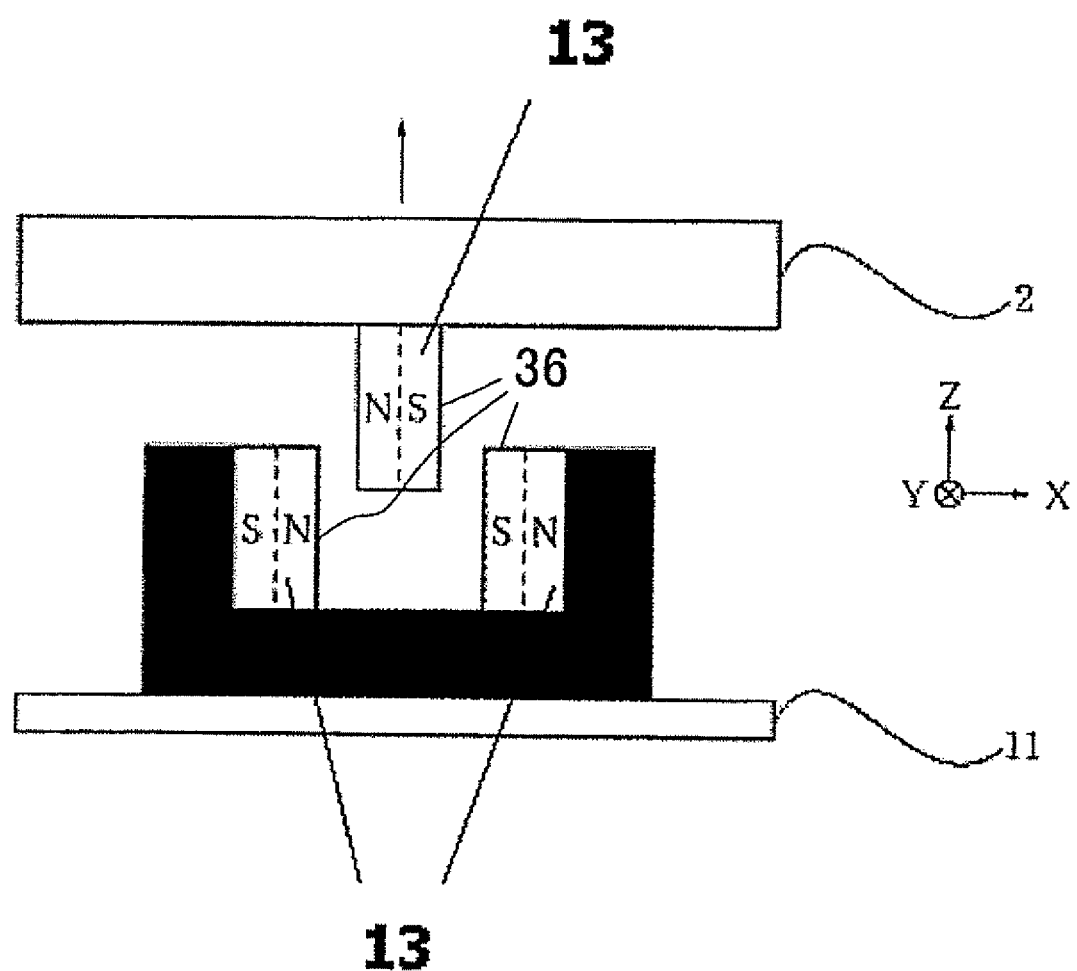
FIG. 9 shows an example of a repellent magnet structure.

The repellent force can be generated with a total of three magnets 13 as shown in FIG. 9. Though the intermediate block 2 fixes one magnet 13 and the additional weight 11 fixes two magnets 13 in FIG. 9, the arrangements of the magnets on the intermediate block 2 and that on the additional weight 11 are changeable. The bearing 10 can use the hydrostatic type in non-vacuum state. In the EUV exposure apparatus (not shown), which is mainly explained in this embodiment, a step-shaped ventilation should be provided around the hydrostatic bearing. The fixed block supports the conductor plate 10 in this case.

Accordingly, the system 9 for holding and adjusting the optical element can compactly arrange the mass dampener and obtain high accuracy positioning.

This embodiment can control the vibration of the optical element 1 (the target), caused by the drive of the actuator 4 for positioning and aligning the optical element 1 (the target), by using the magnetic mass dampener shown in FIG. 4.

It can also control the vibration of the optical element 1 (the target) caused by vibrations from outside the exposure apparatus, such as the vibration from the building where the exposure apparatus is installed, by using the magnetic mass dampener shown in FIG. 4.

Additionally, by using the magnetic dampener as shown in FIG. 4, it can stably control the vibration with little age deterioration and prevent decrease of the EUV light due to degas or dust.

[The Second Embodiment]

Figure 7:
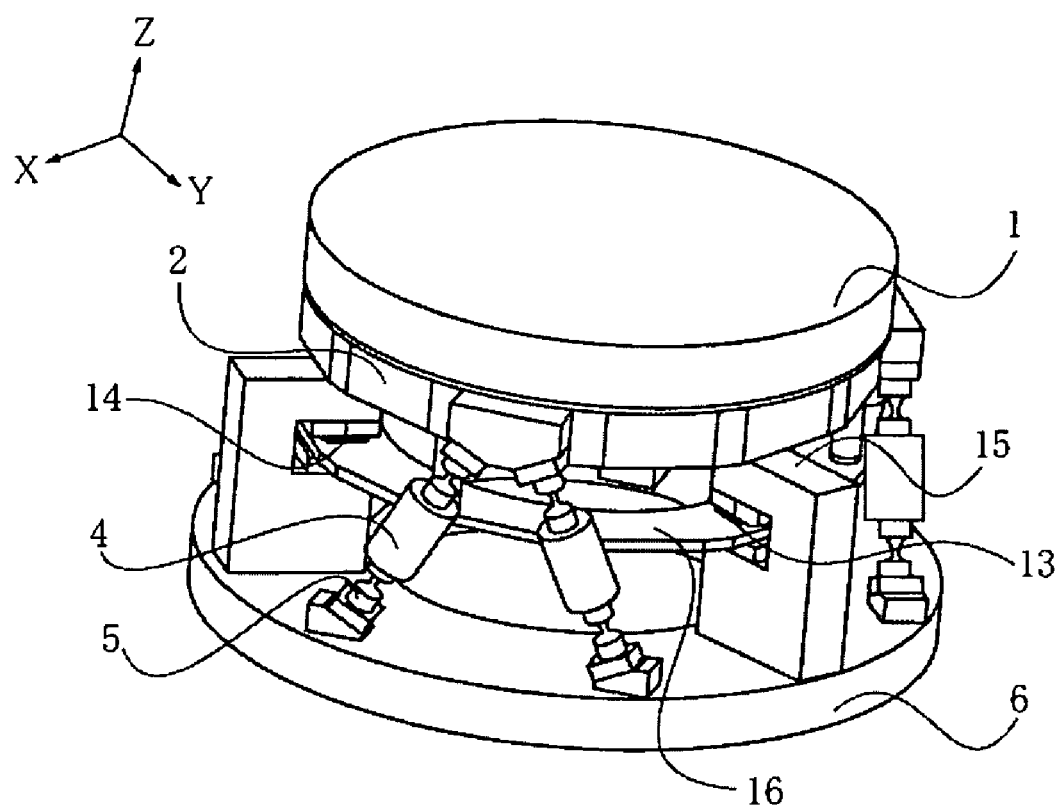
FIG. 7 is a schematic perspective view of a system for holding and adjusting the optical element using a counter electromotive force dampener.

FIG. 7 shows a system 9 for holding and adjusting the optical element which includes a drive unit according to the second embodiment of the present invention.

The method 4 "To add the dampener for increasing the dampening factor of the system 9 for holding and adjusting the optical element" is elected in this embodiment. This is the same as in the first embodiment. A dampener using back electromotive force is applied to the system 9 for holding and adjusting the optical element will be explained later.

A voltage e generated in crossing a coil in a specific magnetic field is described as:

$$e = nBl\dot{x} \quad (5)$$

Here, n is a turn of the coil, B is a magnetic flux density at the coiled position, l is an effective length of the coil, and $\dot{x}$ is a moving speed of the coil.

According to the equation (5), the current i which flows in the coil is described using R as an internal resistance as follows:

$$i = \frac{nBl\dot{x}}{R} \quad (6)$$

The force F by the current to the coil is described as follows:

$$F = \frac{(nBl)^2 \dot{x}}{R} \quad (7)$$

Therefore, by appropriately deciding the above parameters in accordance with the apparatus, the dampening coefficient can be controlled.

FIG. 7 shows an example concerning this. A driving unit in this example arranges a vibration control plate 16, supported to the intermediate block 2, via the bearing, for generating dampening force in the XY plane. The intermediate block 2 and the vibration control plate 16 are connected approximately rigid.

The coil 14, provided on the vibration control plate 16, is arranged in the gap between the pairs of magnets 13, which are supported by the fixed block 6. The magnets 13 are arranged to face and attract each other. Preferably, the coil 14 is an ellipse having two straight parts. For example, it may be a combination of two semi-circle and two straight lines, or four quarter-circle and four segments with the rectangular corners rounded. In this case, it is preferable that the straight part faces the circumferential direction of the optical element (the tangential direction of the circle if the optical element in this embodiment is of circular shape). By crossing the magnetic flux of the magnets 13 facing each other perpendicularly with the straight part of the coil 14 can generate force to the radial direction (the direction perpendicular to magnetic flux direction and circumferential direction of the optical element) of the optical element as the target and control the vibration. A total of six coils 14 are arranged evenly at three circumferential positions on each surface of the vibration control plate 16. However, the coils 14 may be arranged at different positions when the number of coils 14 changes or only on one surface of the vibration control plate 16 to shorten the gap of the magnets 13. The positions of the coils 14 and the magnets 13 may also be changed. For example, the coil 14 may be supported by the fixed block 6 and may be arranged in the gap between the magnets 13 that are fixed on the vibration control plate 16 and on the intermediate block 2 to face each other.

Figure 8:
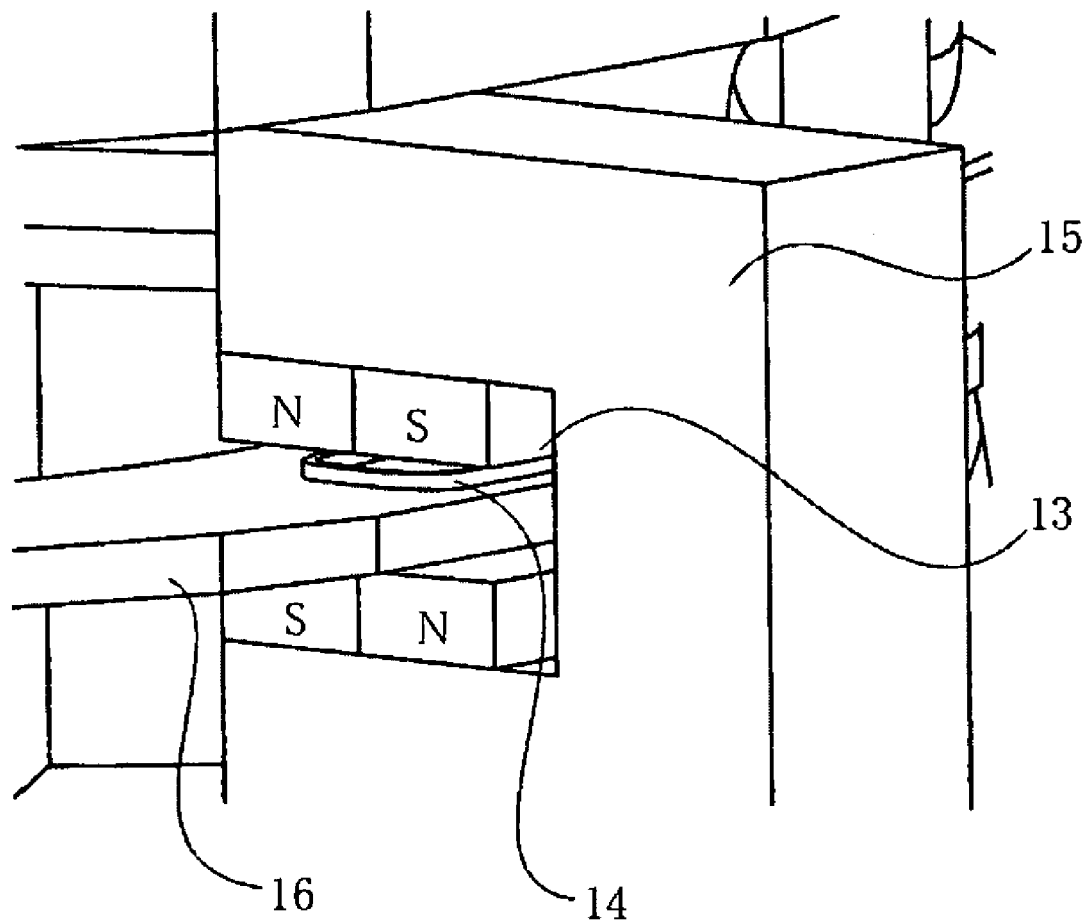
FIG. 8 is an enlarged view of a coil and a magnet.

FIG. 8 is an enlarged view of a part of the magnet 13 and the coil 14. The magnets 13 having different polarities are preferably arranged at the positions corresponding to two straight parts of the coil 14. In other words, in a direction approximately opposite where the magnetic flux is generated and at positions corresponding to two straight parts of the coil 14.

Accordingly, the system 9 for holding and adjusting the optical element can arrange the dampener compactly and obtain high accuracy positioning.

This embodiment can control the vibration of the optical element 1 (the target) caused by the drive of the actuator 4, used for positioning and aligning the optical element 1 (the target), by using the counter electromotive force dampener as shown in FIG. 7.

It can also control the vibration of the optical element 1 (the target) caused by the vibration from outside of the exposure apparatus, such as the vibration of the building where the exposure apparatus is installed, by using the counter electromotive force dampener shown in FIG. 7.

Additionally, it can stably control the vibration with little age deterioration and prevent decrease of the EUV light caused by the degas or dust, by using the counter electromotive force dampener shown in FIG. 7.

[The Third Embodiment]

Figure 10:
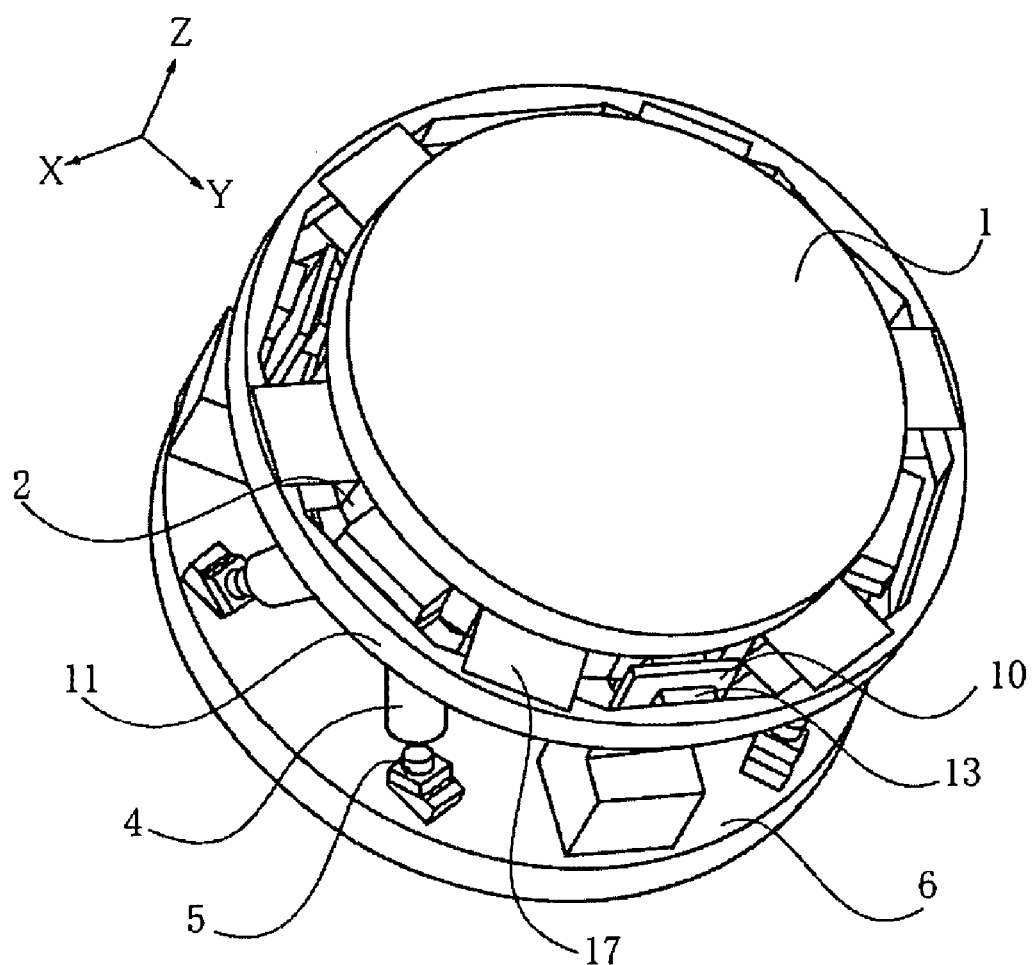
FIG. 10 is a schematic perspective view of a system for holding and adjusting the optical element by applying the magnetic mass dampener in the Z-direction.

Referring now to FIG. 10, a description will be given of a driving unit of the third embodiment according to the present invention. The first embodiment and the second embodiment mainly provide dampening force in the XY plane. The third embodiment will describe a method for providing the dampening force in the Z direction. This embodiment combined with the first and/or the second embodiment can provide the dampening force in both the XY and Z directions.

FIG. 10 shows a mass dampener for dampening in the Z direction of this embodiment. The description of the mass dampener's principle, which is the same as explained in the first embodiment, will be omitted.

An additional weight 11 is cylindrical shape and is arranged outside the intermediate block 2 [further from the optical axis of the optical element (as a target) than the intermediate block] in this embodiment. Preferably, the additional weight 11 uses a magnetic material as a yoke. The magnets 13 are arranged to attract each other in the gap between the intermediate block 2 and the additional weight 11. Though the magnets 13 are described in the FIG. 10 as rectangular shape, they may have cylindrically curved surfaces in order to fit the cylindrically curved surface of the additional weight 11. The magnets 13 are preferably arranged evenly on the circumference. In this embodiment, three pairs of magnets 13 were evenly arranged at 120 degree with each centering the optical axis of the optical element.

A leaf spring 17 supports the cylindrical shaped additional weight 11 around the intermediate block 2, keeps the gap between the magnets 13, and maintains the degree of freedom in the Z direction. The preferable design is to have the sum of the rigidity of the leaf spring 17 in the Z direction and the rigidity generated by the magnetic spring approximately satisfy the equation (1). Preferably, the leaf springs 17 are evenly arranged on the circumference, and may be fixed to both the surfaces of the additional weight 11 and the intermediate block 2.

A conductor plate 10, in the gap between the magnets 13 and supported by the fixed block 6, provides the dampening force for generating eddy current with relative movement to the additional weight 11 on the intermediate block 2.

Accordingly, the system 9 for holding and adjusting the optical element can compactly arrange the dampener and obtain high accuracy positioning.

This embodiment can control the vibration of the optical element 1 (the target), caused by the drive of the actuator 4 for positioning and aligning the optical element 1 (the target), by using the magnetic mass dampener shown in FIG. 10.

It can also control the vibration of the optical element 1 (the target), caused by the vibration from outside of the exposure apparatus, such as the vibration of the building where the exposure apparatus is installed, by using the magnetic mass dampener shown in FIG. 10.

Additionally, it can stably control the vibration with little age deterioration and prevent decrease of the EUV light caused by the degas or the dust, by using the magnetic mass dampener as shown in FIG. 10.

[The Fourth Embodiment]

Figure 11:
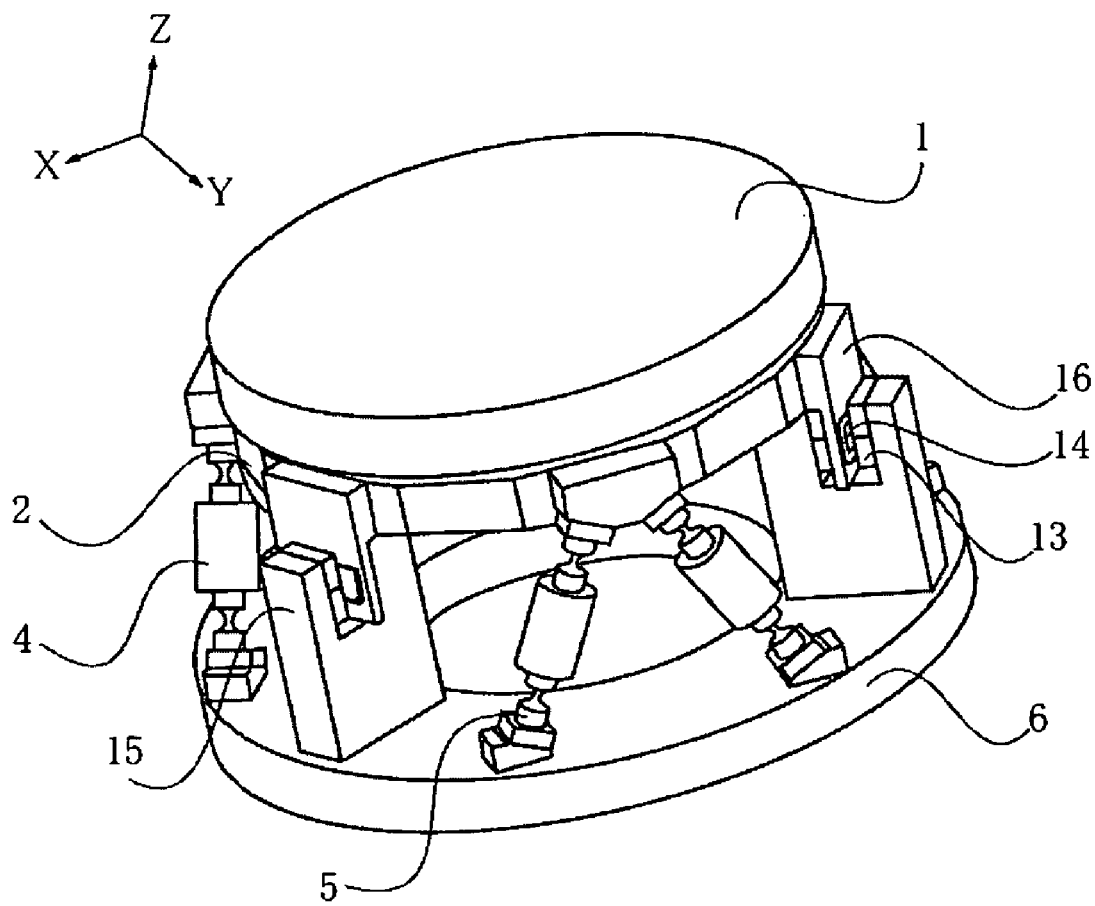
FIG. 11 is a schematic perspective view of a system for holding and adjusting the optical element by applying the counter electromotive force dampener in Z-direction
Figure 12:
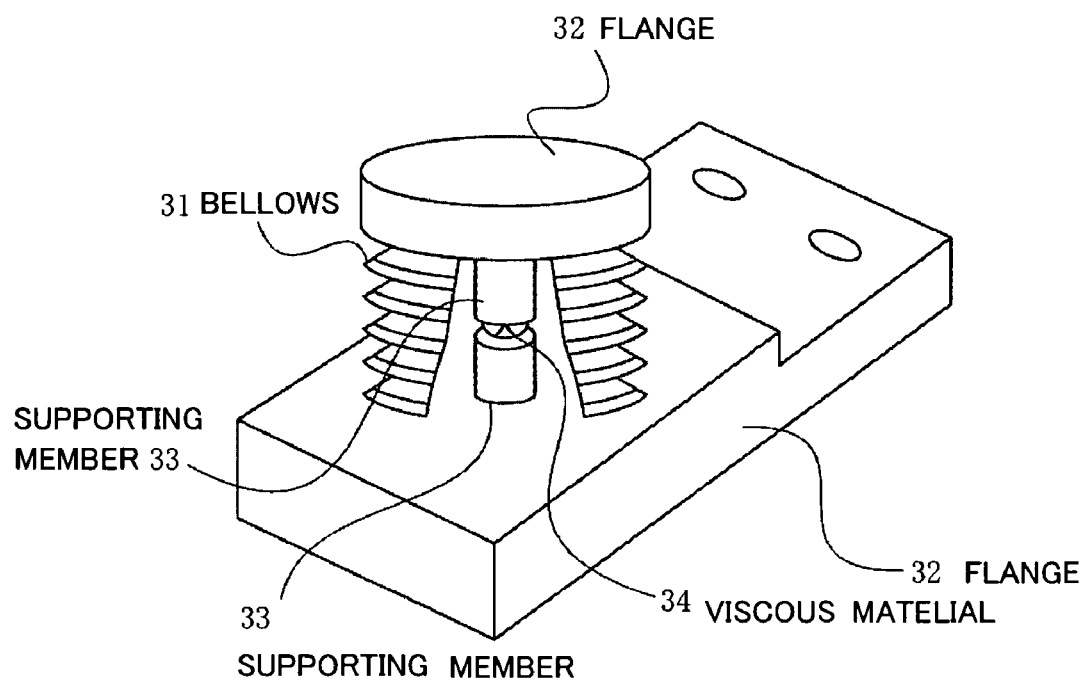
FIG. 12 is a view of a driving unit using a conventional viscous elastic material.

Referring now to FIG. 11, a description will be given of a driving unit of the fourth embodiment according to the present invention. The first embodiment and the second embodiment provide the dampening force mainly in the XY plane. The fourth embodiment will describe another method for providing the dampening force in the Z direction. This embodiment combined with the first and/or the second embodiment can provide the dampening force in both the XY and Z directions.

FIG. 11 is a schematic perspective view of a system 9 for holding and adjusting the optical element with a dampener which uses counter electromotive force for dampening in the Z-direction of this embodiment. The description of the principle of the dampener using the counter electromotive force and the detailed structure according to the dampener using the counter electromotive force will be omitted because it was explained before in the second embodiment.

In this embodiment, a movable coil 14 is arranged on a vibration control plate 16, which is installed to an intermediate block 2. Preferably, the movable coil 14 is an ellipse with a straight part. The straight part is preferably arranged to perpendicularly cross the Z direction in a tangent direction. The coil 14 may be provided on both surfaces of the vibration control plate. Also, preferably, a plurality of the coil 14 is arranged evenly on the circumference of the intermediate block 2. One vibration control plate 16 may function as a plurality.

The magnets 13 on the fixed side, for example, are supported by the fixed block 6. A pair of magnets 13 is arranged around both sides of the coil 14 to attract each other. Detailed description for installation of the magnet 13 is approximately the same as in FIG. 8. The magnet should be arranged so that the magnetic flux direction around one side of the straight part of the coil 14 is opposite to that around the other side of the straight part of the coil 14.

Accordingly, the system 9 for holding and adjusting the optical element can compactly arrange the dampener and obtain high accuracy positioning.

The exposure apparatus shown in FIG. 2, which has the optical element as the target and is supported by the driving unit described in the first to the third embodiments to control vibration, can also apply the driving unit of this embodiment. An illumination optical system which approximately illuminates a mask (or a reticle) evenly with light from the light source is not shown in FIG. 2. However, the illumination optical system can include the driving unit of this embodiment. Needless to say, a projecting optical system which guides the light from the mask to a wafer (an object) may include the driving unit of this embodiment.

This embodiment can control the vibration of the optical element 1 (the target), caused by the drive of the actuator 4 for positioning and aligning the optical element 1 (the target), by using the counter electromotive force dampener as shown in FIG. 11.

It can also control the vibration of the optical element 1 (the target), caused by the vibration from outside of the exposure apparatus, such as the vibration of the building where the exposure apparatus is installed, by using the counter electromotive force dampener shown in FIG. 11.

Additionally, it can stably control vibration with little age deterioration and prevent decrease of the EUV light caused by the degas or the dust, by using the counter electromotive force dampener as shown in FIG. 11.

[The Fifth Embodiment]

Figure 13:
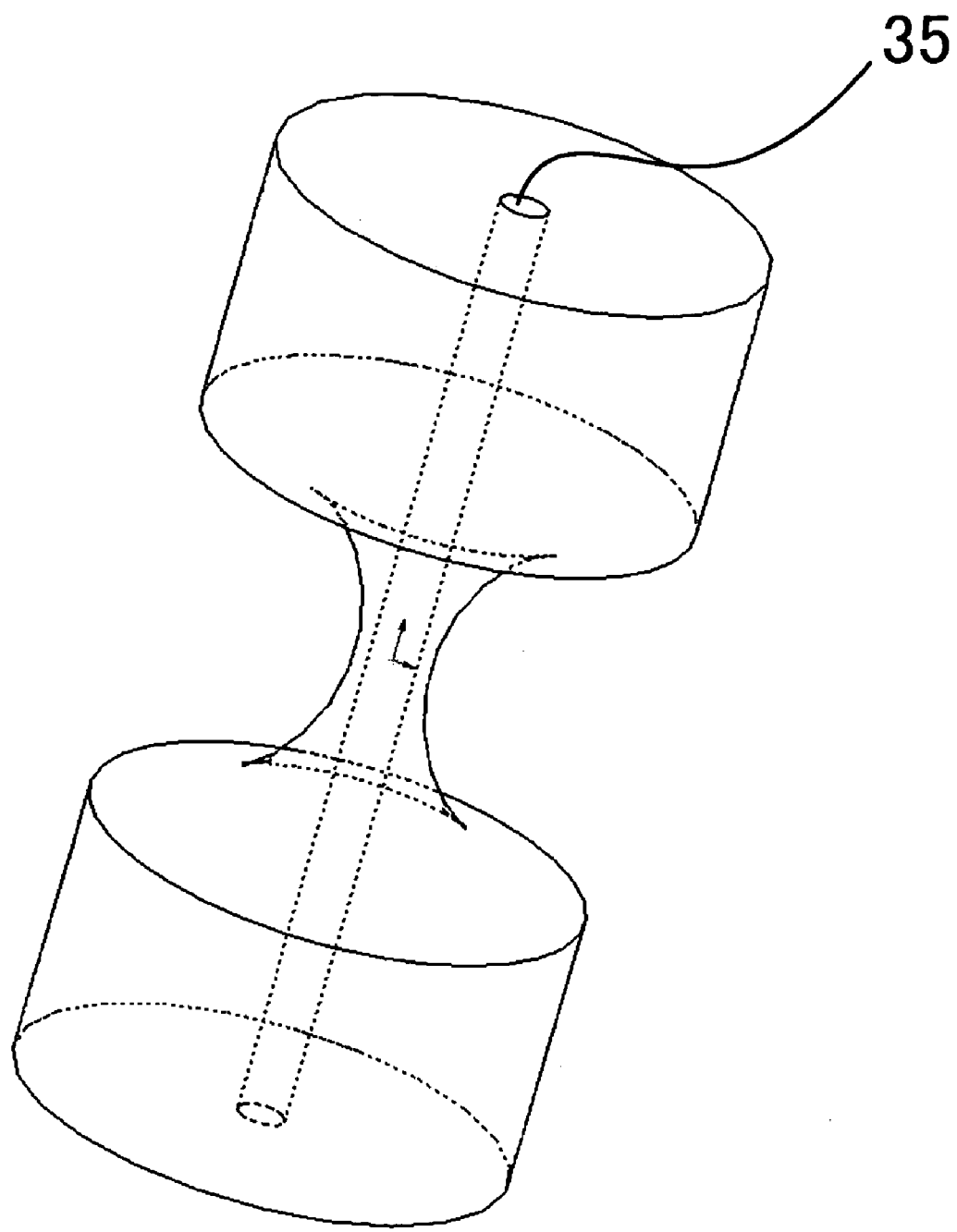
FIG. 13 is a schematic view of an elastic hinge according to the fifth embodiment.

Magnetic vibration control methods for the adjustment mechanism of the optical element by using parallel mechanisms were explained in the first to fourth embodiment. A vibration control block having an elastic hinge structure shown in FIG., 13 is used for the dampening method of the structure shown in FIG. 4. The elastic hinge as shown in FIG. 13 is a rod, which is narrowed at approximately the center of the longitudinal direction by cutting, can deform elastically at the narrowed portion. The elastic hinge has an approximately rotational symmetrical shape centering a specific axis and can be deformed in any direction perpendicular to the longitudinal direction of the elastic hinge.

A pit whose direction agrees with the rotational symmetrical axis is formed in the elastic hinge. A vibration control material 35 is inserted in the pit and is shielded by means of welding or the like. The elastic hinge does not function only as a spring, but also as a dampener. Mechanical dampening which can be used in vacuum state and hardly generates dust or degas (substantially no dust and no degas) can be realized with use of the elastic hinge as a connecting mechanism for parallel mechanism etc., for connecting the intermediate block 2 and the additional weight 2 as shown in FIG. 4 or FIG. 10, and for connecting the intermediate block 2 and the vibration control plate 16 as shown in FIG. 7 or FIG. 11.

The number of the pit formed in the elastic hinge may be one or more. The pit does not need to penetrate. One non-penetrating pit may be formed in the elastic hinge.

This invention will be effective when the longitudinal length of the non-penetrating pit is ¼ or more of the elastic hinge.

The longitudinal direction is a normal direction of the pit.

The pit may be a cylindrical shape as in FIG. 13 or a polygon pillar shape.

The elastic hinge may be pillar shaped as shown in FIG. 6A and FIG. 6B, instead of the rotational symmetrical shape shown in FIG. 13 and FIG. 6C. The leaf spring type elastic hinge may be holed, filled with vibration control material 35 in the hole, and plugged to shield the vibration control material 35. Preferably, the vibration control material 35 is preferably completely encased. The vibration control material can use foam rubber, gel, oil, grease, or any other material used in dampener steel.

The vibration control material may have a damping coefficient of 10 to $10^3$ Ns/m, preferably 30 to 500 Ns/m.

The elastic hinge may be used in conjunction with the magnetic dampeners described in the first to the fourth embodiment, or may be used instead of the magnetic dampeners described in the first to the fourth embodiment.

The vibration control method using the shielded vibration control material 35 does not apply only to the elastic hinge explained before, but also applies to a block for vibration control or to various shapes such as a stick. For example, the compact dampener can utilize the vibration control material 35 not only to the part of the elastic hinge explained before, but also to the block arranged on both sides of the elastic hinge. However, the design should take into consideration the decrease of mechanical strength of the element when it's hollowed.

Figure 14:
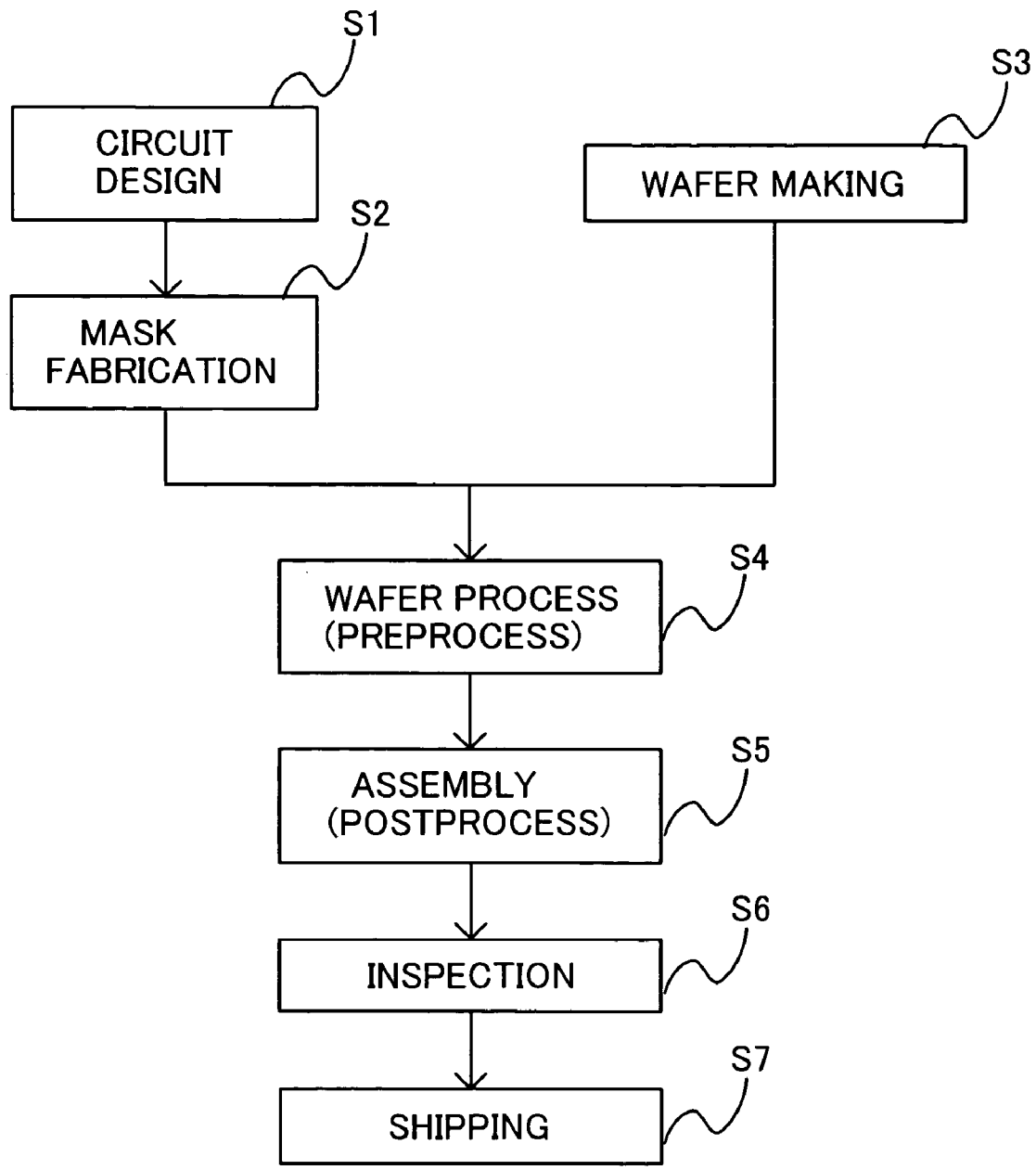
FIG. 14 is a flowchart for explaining a method for fabricating devices (semiconductors like IC, LSI, LCD, CCD, etc).
Figure 15:
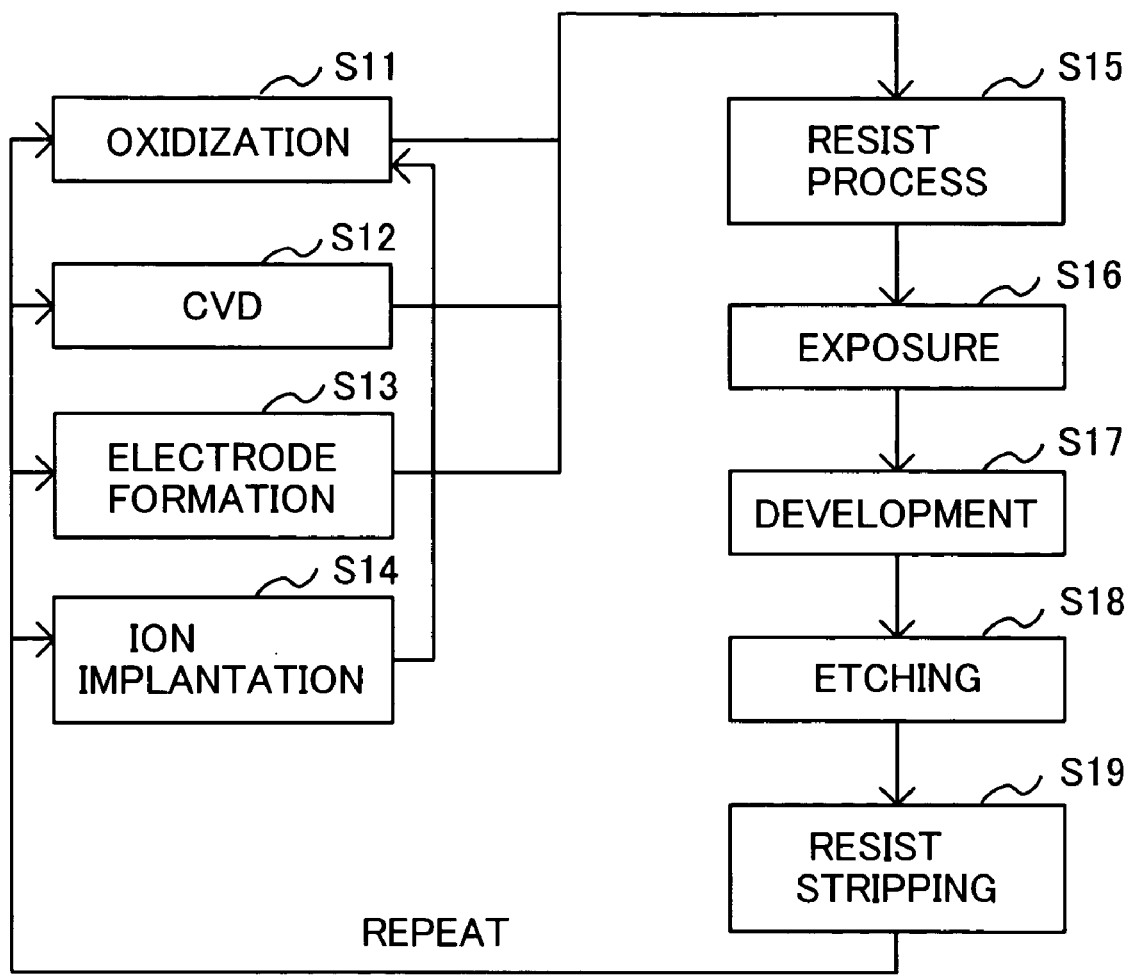
FIG. 15 is a detailed flowchart for Step 4 of the wafer process shown in FIG. 4.

Referring now to FIGS. 14 and 15, a description will be given of an embodiment of a device fabricating method using the above exposure apparatus as shown in FIG. 2. FIG. 14 is a flowchart for explaining fabrication of devices (i.e., semiconductor chips such as IC and LSI, LCDs, CCDs, etc.). Here, as an example, a description will be given of a semiconductor chip fabrication. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), referred to as a pretreatment, forms the actual circuitry on the wafer through photolithography using the mask and wafer. Step 5 (assembly), also referred to as a posttreatment, forms the wafer from Step 4 into a semiconductor chip and includes an assembly step (e.g., dicing, bonding), a packaging step (chip sealing), and the like. Step 6 (inspection) performs various tests on the semiconductor device made in Step 5, such as validity test and durability test. Through these steps, a semiconductor device is finished and shipped (Step 7).

FIG. 15 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus to expose a circuit pattern on the mask onto the wafer. Step 17 (development) develops the exposed wafer. Step 18 (etching) etches parts other than a developed resist image. Step 19 (resist stripping) removes unused resist after etching. These steps are repeated to form multilayer circuit patterns on the wafer. The device fabrication method of this embodiment may manufacture higher quality devices than the conventional one. Accordingly, the device fabricating method and the devices as products are also within the scope of the present invention.

As explained above, the first to fifth embodiment according to the present invention can provide a clean, no degas and dust, driving unit that can be arranged compactly in an apparatus installed in vacuum state. Therefore, the target can be accurately positioned.

This invention controls the vibration of the target generated by the actuation of the actuator by using a magnetic damper.

Further, the present invention is not limited to these preferred embodiments. Various variations and modifications may be made without departing from the scope of the present invention.

What is claimed is:

1. A driving unit comprising:
   an actuator for actuating a target; and
   a magnetic dampener for damping a vibration of the target,
   wherein said magnetic dampener comprising:
   at least one first magnet fixed to the target;
   an additional weight located at a distance from the target;
   at least one second magnet having a polarity opposite to the first magnet, wherein said second magnet is fixed to the additional weight to face the first magnet; and
   a conductor plate arranged between the first magnet and the second magnet.

2. A driving unit according to claim 1, further comprising a magnetic spring, wherein the driving unit damps the vibration of the target by using the magnetic spring and the magnetic dampener.

3. A driving unit according to claim 1, wherein the actuator comprises a piezoelectric element.

4. A driving unit according to claim 1, wherein the conductor plate is fixed to the target or the additional weight.

5. A driving unit according to claim 1, wherein the conductor plate is fixed to a fixing block which is different from the target or the additional weight.

6. A driving unit according to claim 1, wherein the conductor plate comprises a cooling unit which cools the target.

7. A driving unit according to claim 6, wherein the cooling unit cools the target by radiation.

8. A driving unit according to claim 7, wherein the cooling unit having a radiation element facing the target, cools the target by using the radiation element.

9. A driving unit according to claim 8, comprising a Peltier device for cooling the radiation element.

10. A driving unit according to claim 1, comprising: at least one third magnet fixed to the target; and at least one fourth magnet arranged to be repellent to the third magnet, wherein said fourth magnet is fixed to the additional weight to face the third magnet.

11. A driving unit according to claim 1, comprising a bearing for joining the target and the additional weight, wherein the bearing substantially maintains the relative positions between the target and the additional weight in a first direction.

12. A driving unit according to claim 11, wherein the bearing makes the target and the additional weight movable in two directions approximately perpendicular to said first direction.

13. A driving unit according to claim 11, wherein said first direction is the same as a direction of magnetic flux between at least one said first magnet and at least one said second magnet.

14. A driving unit according to claim 11, wherein said bearing comprises an elastic hinge.

15. A driving unit according to claim 11, wherein said bearing comprises a pair of permanent magnets facing the same polar as each other.

16. A driving unit according to claim 11, wherein said bearing comprises a leaf spring.

17. A driving unit according to claim 11, wherein said bearing comprises a ball bearing.

18. A driving unit according to claim 11, wherein said bearing comprises a hydrostatic bearing.

19. A driving unit according to claim 18, wherein a ventilator is provided around the hydrostatic bearing.

20. A driving unit according to claim 1, further comprising: a magnetic flux generator for generating a magnetic flux in a first direction; and a coil having a straight part along a second direction perpendicular to the first direction, wherein said driving unit controls the vibration of the target in a third direction perpendicular to both the first and the second directions.

21. A driving unit according to claim 20, wherein the coil is fixed to the target, and the magnetic flux generator is fixed to a structure supported independently from the target.

22. A driving unit according to claim 20, wherein the coil comprises a first straight part and a second straight part in which a current flow in a direction opposite to the flow direction in the first straight part, and the magnetic flux near the first straight part is substantially opposite to that near the second straight part.

23. A driving unit according to claim 1, wherein the target comprises an optical element.

24. A driving unit according to claim 23, wherein the optical element is a reflection element.

* * * * *